United States Patent
Figura et al.

[11] Patent Number: 5,808,854
[45] Date of Patent: *Sep. 15, 1998

[54] CAPACITOR CONSTRUCTION WITH OXIDATION BARRIER BLOCKS

[75] Inventors: Thomas A. Figura; Paul J. Schuele, both of Boise, Id.

[73] Assignee: Micron Technology, Inc., Boise, Id.

[*] Notice: The term of this patent shall not extend beyond the expiration date of Pat. No. 5,559,666.

[21] Appl. No.: 687,248

[22] Filed: Jul. 25, 1996

Related U.S. Application Data

[60] Continuation of Ser. No. 447,750, May 23, 1995, Pat. No. 5,559,666, which is a division of Ser. No. 328,095, Oct. 24, 1994, Pat. No. 5,464,786.

[51] Int. Cl.⁶ .................................................. H01G 4/06
[52] U.S. Cl. .................... 361/321.4; 257/306; 501/134; 501/136; 501/137; 361/303; 361/321.1; 361/321.3; 361/321.5
[58] Field of Search .......................... 257/295, 300–303, 257/306–311; 361/311–313, 320–322, 303–305; 365/145, 149; 501/134–139

[56] References Cited

U.S. PATENT DOCUMENTS

| | | | |
|---|---|---|---|
| 5,335,138 | 8/1994 | Sandhu et al. | 361/303 |
| 5,371,700 | 12/1994 | Hamada | 365/149 |
| 5,381,302 | 1/1995 | Sandhu et al. | 361/303 |
| 5,392,189 | 2/1995 | Fazan et al. | 361/305 |
| 5,459,345 | 10/1995 | Okudaira et al. | 257/310 |
| 5,554,866 | 9/1996 | Nishioka et al. | 257/295 |
| 5,559,666 | 9/1996 | Figura et al. | 361/321.4 |
| 5,567,964 | 10/1996 | Kashihara et al. | 257/310 |

*Primary Examiner*—Bot L. Ledynh
*Attorney, Agent, or Firm*—Wells, St. John, Roberts, Gregory & Matkin, P.S.

[57] ABSTRACT

A capacitor apparatus includes, a) a substrate having a node; b) an inner capacitor plate in ohmic electrical connection with the substrate node; c) an outer capacitor plate; d) a capacitor dielectric layer interposed between inner and outer capacitor plates; e) an electrically conductive reaction barrier layer interposed between the substrate node and the inner capacitor plate, the reaction barrier layer having outer lateral edges which are recessed beneath the inner capacitor plate; and f) oxidation barrier blocks being received over the recessed outer lateral edges beneath the inner capacitor plate. Methods of forming such a capacitor are also disclosed.

1 Claim, 6 Drawing Sheets

Fig 15

CAPACITOR CONSTRUCTION WITH OXIDATION BARRIER BLOCKS

RELATED PATENT DATA

The present application is a continuing application of application Ser. No. 08/447,750, entitled "Capacitor And Capacitor Forming Method", filed on May 23, 1995, now U.S. Pat. No. 5,559,666, and which is a division of U.S. patent application Ser. No. 08/328,095, filed on Oct. 24, 1994, now U.S. Pat. No. 5,464,786, issued Nov. 7, 1995.

PATENT RIGHTS STATEMENT

This invention was made with government support under Contract No. MDA972-93-C-0033, awarded by Advanced Research Projects Agency (ARPA). The government has certain rights in this invention.

TECHNICAL FIELD

This invention methods of forming capacitors and to capacitor constructions.

BACKGROUND OF THE INVENTION

Figure 1:
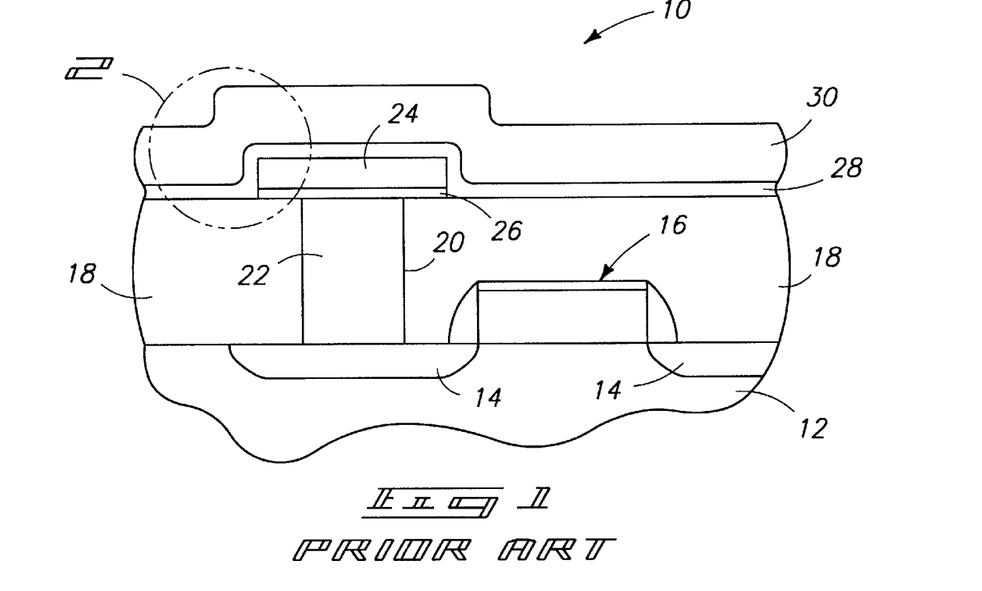
FIG. 1 is a diagrammatic sectional view of a theoretical prior art semiconductor wafer fragment, and is discussed in the "Background" section above.

The invention arose from concerns associated with undesired oxide formation in capacitors wherein the lower capacitor plate comprises platinum and the capacitor dielectric material is barium strontium titanate. A typical prior art construction is shown in FIG. 1, and includes a semiconductor wafer fragment indicated generally by reference numeral 10. Such comprises a bulk substrate 12 having associated source/drain areas 14 provided therewithin and a patterned electrically conductive word line 16 formed thereatop. An electrically insulating borophosphosilicate glass (BPSG) layer 18 is provided over substrate 12 and word line 16. A contact opening 20 is provided to extend downwardly to one of source/drain regions 14 for providing electrical connection relative to a capacitor. Contact opening 20 is filled with conductively doped polysilicon to form a plug 22.

A lower capacitor plate which makes electrical connection with polysilicon plug 22 is indicated with reference numeral 24, and preferably comprises Pt. It is desirable that the platinum of bottom storage node 24 not interface or interdiffuse with the silicon of plug 22. To prevent such diffusion and reaction, an electrically conductive reaction barrier layer 26, typically TiN is interposed between silicon plug 22 and platinum storage node 24. Subsequently, a thin capacitor dielectric layer 28 is provided over lower capacitor plate 24, followed by a final cell capacitor plate layer 30. An increasingly popular and desired material for capacitor dielectric layer 28 is barium strontium titanate.

Figure 2:
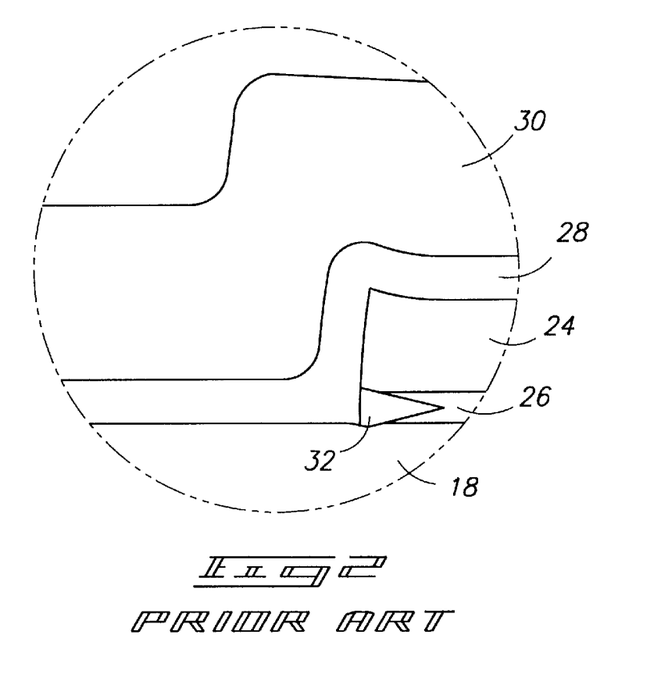
FIG. 2 an enlarged view of a FIG. 1 wafer.
Figure 3:
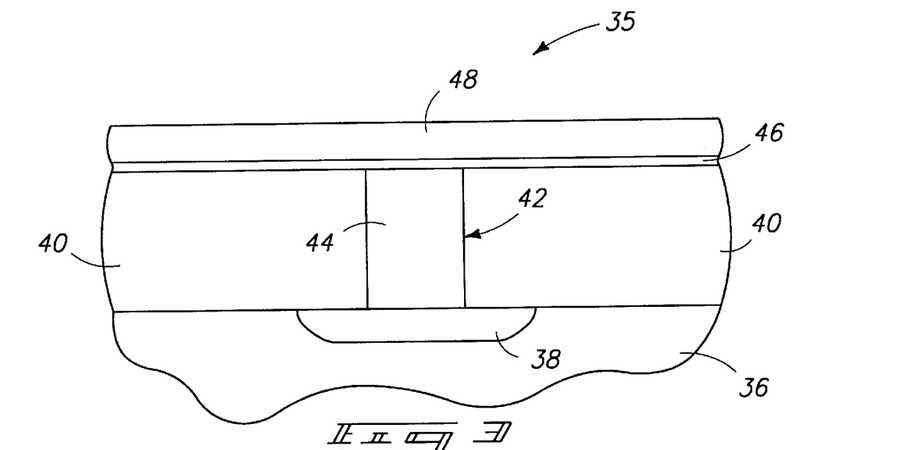
FIG. 3 is a diagrammatic sectional view of a semiconductor wafer fragment at one processing step in accordance with the invention.

The illustrated FIG. 1 construction is the desired ideal, although such does not practically occur during processing. Specifically and with reference to FIG. 2, the provision of TiN layer 26 in combination with a titanate layer such as barium strontium titanate, subjects layer 26 to undesired oxidation. Such results in formation of a wedge-shaped oxide layer 32 resulting from reaction of TiN to form titanium oxide. This actually causes platinum of storage node 26 to rise or wedge upwardly as shown. Such creates stresses and cracking as well as undesirably creating greater varying vertical topography.

It would be desirable to overcome such prior art problems in capacitor constructions.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming a capacitor comprises the following steps:

providing a substrate having a node to which electrical connection to a capacitor is to be made;

providing an electrically conductive reaction barrier layer over the substrate node;

providing a male molding layer over the reaction barrier layer;

etching the male molding layer into an external male shape having lateral confines corresponding to that of a desired finished lower capacitor plate shape;

etching the reaction barrier layer to form opposing lateral recesses beneath the etched male molding layer, the recesses defining opposing recessed lateral reaction barrier layer edges;

providing oxidation barrier blocks over the opposing recessed lateral reaction barrier layer edges;

providing a female molding layer over the etched male molding layer and oxidation barrier blocks;

etching back the female molding layer to outwardly expose the etched male molding layer;

stripping the exposed etched male molding layer from the substrate to leave a female mold having lateral confines corresponding to that of a desired finished lower capacitor plate shape;

providing electrically conductive material within the female mold;

stripping the female molding layer from the substrate to leave a block of the electrically conductive material corresponding in lateral shape to that of a desired finished lower capacitor plate shape; and providing a capacitor dielectric layer and a cell capacitor layer over the electrically conductive block.

In accordance with another aspect of the invention, a method of forming a capacitor comprises the following steps:

providing a substrate having a node to which electrical connection to a capacitor is to be made;

providing an electrically conductive reaction barrier layer over the substrate node;

providing an electrically conductive lower capacitor plate layer over the reaction barrier layer;

etching the lower capacitor plate layer into an external shape having lateral confines corresponding to that of a desired finished lower capacitor plate shape;

etching the reaction barrier layer to form opposing lateral recesses beneath the etched lower capacitor plate layer, the recesses defining opposing recessed lateral reaction barrier layer edges;

providing oxidation barrier blocks over the opposing recessed lateral reaction barrier layer edges; and providing a capacitor dielectric layer and a cell capacitor layer over the etched lower capacitor plate layer.

In accordance with still a further aspect of the invention, a capacitor apparatus comprises:

a substrate having a node;

an inner capacitor plate in ohmic electrical connection with the substrate node;

an outer capacitor plate;

a capacitor dielectric layer interposed between inner and outer capacitor plates;

an electrically conductive reaction barrier layer interposed between the substrate node and the inner capacitor plate, the reaction barrier layer having outer lateral edges which are recessed beneath the inner capacitor plate; and oxidation barrier blocks being received over the recessed outer lateral edges beneath the inner capacitor plate.

More particularly and with reference to FIGS. 3–15, a semiconductor wafer fragment at one processing step in accordance with the invention is indicated generally by reference numeral 35. Such comprises a bulk substrate 36 having a conductively doped diffusion region 38. A planarized layer 40 of insulating material, such as borophosphosilicate glass (BPSG), is provided atop substrate 36. A contact opening 42 is etched through insulating layer 40 inwardly to active diffusion region 38. Contact 42 is filled with an electrically conductive material 44, preferably polysilicon. Plug 44 constitutes a node to which electrical connection to a capacitor is to be made. An electrically conductive reaction barrier layer 46 is provided atop planarized insulating layer 40 over node 46. An example and preferred material is TiN deposited to a thickness of 1000 Angstroms. A male molding layer 48 is provided over reaction barrier layer 46. Such is preferably deposited to a thickness equalling the desired final thickness of a lower capacitor storage plate. An example preferred material is polysilicon.

Figure 4:
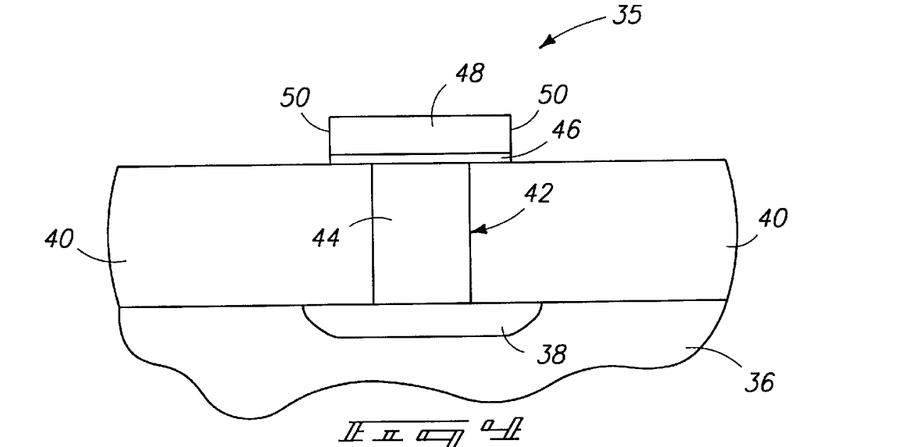
FIG. 4 is a view of the FIG. 3 wafer fragment at a processing step subsequent to that shown by FIG. 3.
Figure 5:
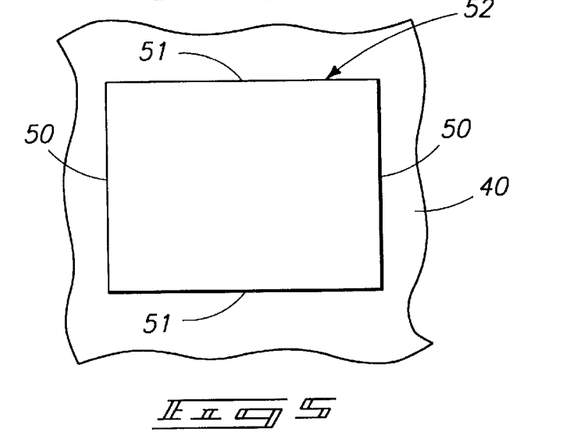
FIG. 5 is an enlarged top view of FIG. 4.

Referring to FIGS. 4 and 5, male molding layer 48 is etched into an external male shape having opposed lateral confines or lateral edges 50 which correspond to that of a desired finished lower capacitor plate shape. Reaction barrier layer 46 is also etched as shown using the same photomask. Example etching chemistry for polysilicon would include fluorine, bromine or chlorine containing gases. For TiN, gases utilized would typically be fluorine or chlorine. Preferably, the step of etching the male molding layer comprises etching said layer into an external male shape which corresponds completely to the external edge confines of the finished lower capacitor plate shape, to provide adjacent and opposed edges 51 (FIG. 5). Accordingly, FIG. 5 illustrates an external male shape 52 which corresponds completely to the external edge confines of the desired finished lower capacitor plate.

Figure 6:
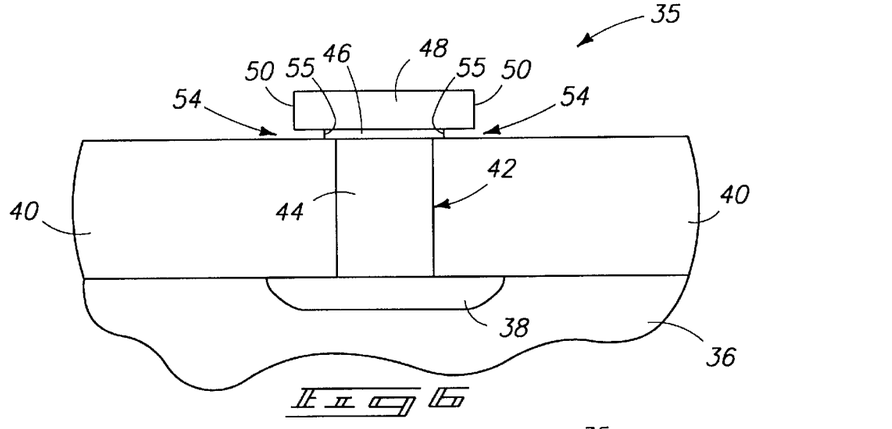
FIG. 6 is a view of the FIG. 3 wafer fragment at a processing step subsequent to that shown by FIG. 5.

Referring to FIG. 6, reaction barrier layer 46 is etched to form opposing lateral recesses 54 beneath etched molding layer 48. Such defines opposing recessed lateral reaction barrier layer edges 55. Ideally, the etch to produce recesses 54 positions lateral reaction barrier layer edges 55 laterally outward away from the node defined by plug 44. Example etch chemistry for producing recesses 54 where reaction barrier layer 46 comprises TiN are $H_2O_2$ and $H_2SO_4$ at a 10:1 ratio by volume, or pure $H_2O_2$.

Figure 7:
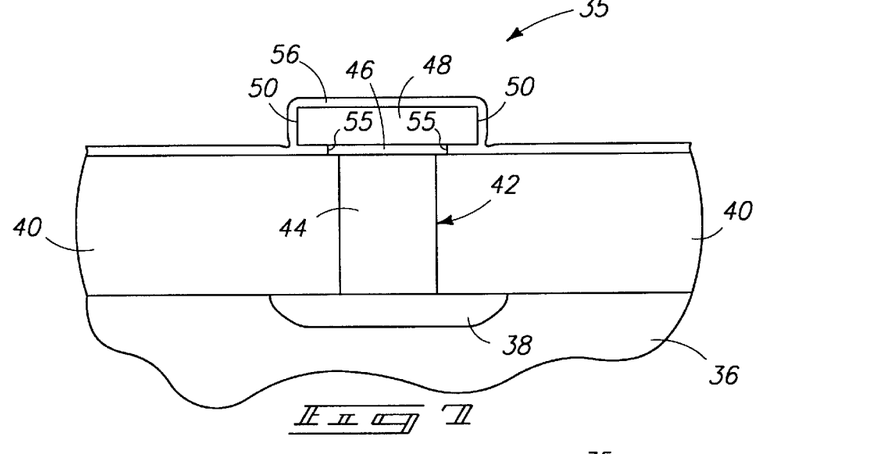
FIG. 7 is a view of the FIG. 3 wafer fragment at a processing step subsequent to that shown by FIG. 6.

Referring to FIG. 7, an oxidation barrier material layer 56 is deposited over the substrate and to within recesses 54 over opposing recessed lateral reaction barrier layer edges 55. Such a deposition is highly conformal to cover edges 55, with an example preferred deposition material being $Si_3N_4$. Also preferably as will be described subsequently, layer 56 preferably comprises a dielectric material.

Figure 8:
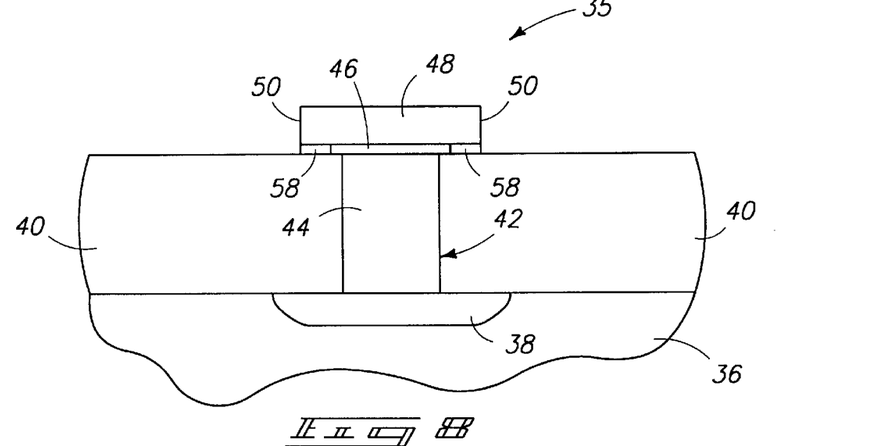
FIG. 8 is a view of the FIG. 3 wafer fragment at a processing step subsequent to that shown by FIG. 7.

Referring to FIG. 8, layer 56 is etched to define oxidation barrier blocks 58. Example and preferred etching conditions to produce the construction of FIG. 8 include either wet hot phosphoric acid or an isotropic dry etch using a fluorine containing gas.

Figure 9:
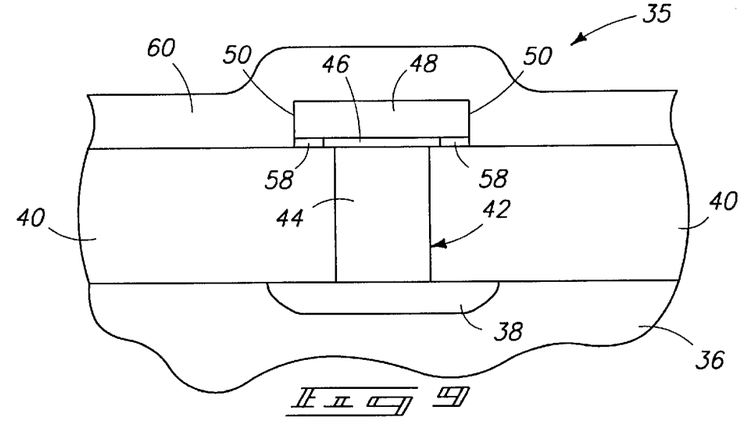
FIG. 9 is a view of the FIG. 3 wafer fragment at a processing step subsequent to that shown by FIG. 8.

Referring to FIG. 9, a female molding layer 60 is provided over etched male molding layer 48 and over oxidation barrier blocks 58. An example and preferred material is an oxide, such as BPSG.

Figure 10:
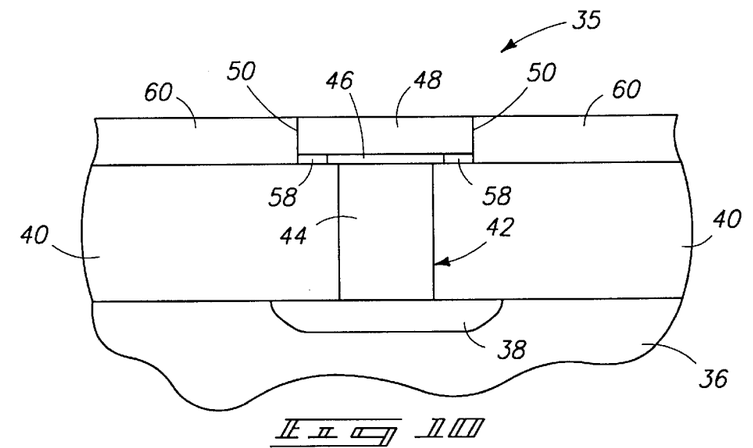
FIG. 10 is a view of the FIG. 3 wafer fragment at a processing step subsequent to that shown by FIG. 9.

Referring to FIG. 10, female molding layer 60 is planarized etched back to outwardly expose etched male molding layer 48. An example and preferred technique is chemical-mechanical polishing, for example utilizing a slurry comprising silica and KOH in deionized water.

Figure 11:
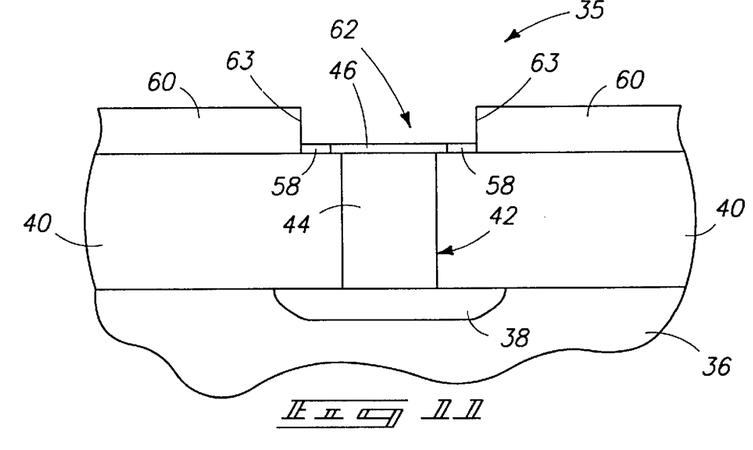
FIG. 11 is a view of the FIG. 3 wafer fragment at a processing step subsequent to that shown by FIG. 10.
Figure 12:
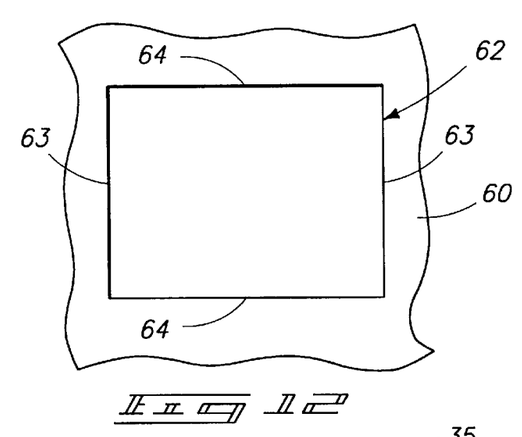
FIG. 12 is an enlarged top view of FIG. 11.

Referring to FIGS. 11 and 12, exposed etched male molding layer 48 is stripped from the substrate to leave an open female mold 62 having lateral confines or lateral edges 63 which correspond to that of a desired finished lower capacitor plate shape. Ideally, female mold shape 62 corresponds completely to the external edge confines of the finished lower capacitor plate shape in the provision of adjacent and opposing edges 64 (FIG. 12).

Figure 13:
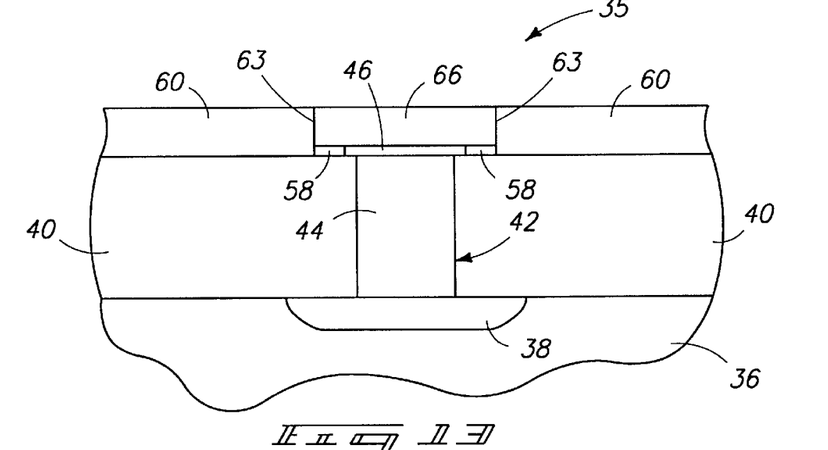
FIG. 13 is a view of the FIG. 3 wafer fragment at a processing step subsequent to that shown by FIG. 11.

Referring to FIG. 13, a layer of electrically conductive material is deposited atop the wafer and within the female mold. Such is etched back, preferably by chemical-mechanical polishing, to provide a conductive block 66 within the mold. A preferred material for layer 66 is Pt.

Figure 14:
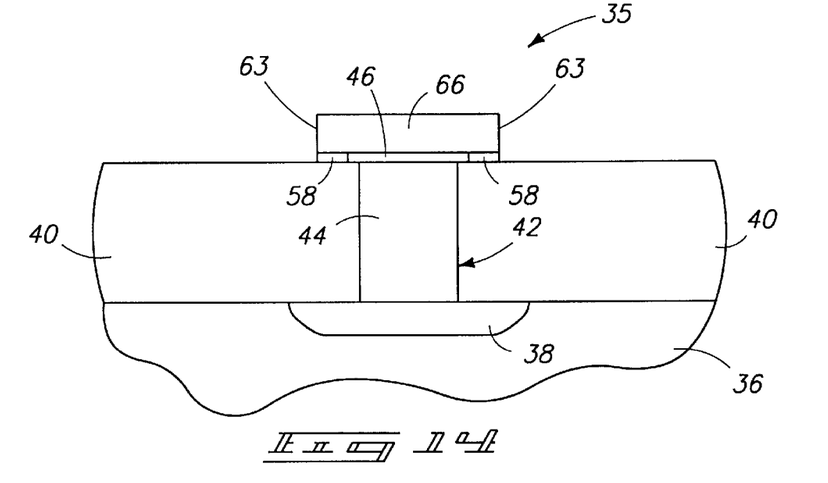
FIG. 14 is a view of the FIG. 3 wafer fragment at a processing step subsequent to that shown by FIG. 12.

Referring to FIG. 14, female molding material 60 is stripped from the substrate to leave electrically conductive block 66 which corresponds in lateral shape to that of a desired finished lower capacitor plate shape. In the described ideal preferred embodiment, such stripping will accordingly define conductive block 66 to correspond completely to the external edge confines of the finished lower capacitor plate shape. An example wet chemistry for stripping material 60 from Pt includes a HF based solution.

Figure 15:
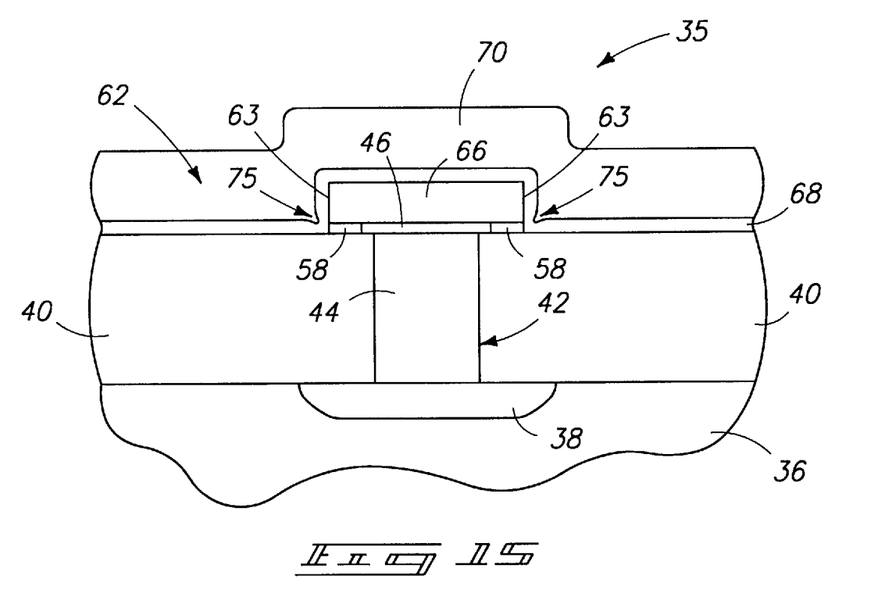
FIG. 15 is a view of the FIG. 3 wafer fragment at a processing step subsequent to that shown by FIG. 13.

Referring to FIG. 15, a capacitor dielectric layer 68 is deposited over the substrate and lower capacitor plate 66.

Such preferably comprises barium strontium titanate. Subsequently, a cell capacitor layer 70 (i.e., platinum) is provided outwardly of cell capacitor layer 68. As will be appreciated by the artisan, oxidation barrier blocks 58 prevent oxidation of reaction barrier layer 46 to prevent the undesired prior art outward wedging of the lower capacitor plate.

Oxidation barrier blocks 58 are preferably also dielectric to assure overall desired capacitance. Specifically, barium strontium titanate as deposited can form sharp cusps or indentations 75 near the oxidation barrier blocks. This effectively reduces the thickness of the dielectric in these regions, and can adversely impact capacitance relative to the lower storage node if oxidation barrier blocks were not made of a dielectric material.

As an alternate process, the described polysilicon layer 48 (FIG. 3) might, preferably be substituted to be the desired finished lower capacitor plate material Pt. Accordingly, the step provided in FIG. 4 would etch the electrically conductive lower capacitor plate into a desired external shape having lateral confines corresponding to that of a desired finished lower capacitor plate. The reaction barrier layer would ultimately be etched to form the opposing lateral recesses beneath the etched lower capacitor plate layer. An example chemistry for wet etching TiN selectively relative to Pt to produce the recesses includes $H_2O_2$ and $H_2SO_4$ at a 10:1 ratio by volume, or pure $H_2O_2$. A subsequent oxidation barrier block layer would then be provided and etched to produce a construction corresponding to that of FIG. 8. The steps illustrated by FIGS. 9–13 are thereby eliminated.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A capacitor construction comprising:

a substrate having an active diffusion region to which electrical connection is to be made;

an insulating layer of a first material positioned in covering relation relative to the substrate, and wherein the insulating layer has a top surface, and further defines a contact opening which extends to the active diffusion region;

an electrically conductive material forming a node received in and completely filling the contact opening, the node being coplanar with the top surface of the insulating layer;

an electrically conductive reaction barrier layer positioned in covering relation relative to the insulating layer, and wherein the electrically conductive reaction barrier layer has lateral edges which are located laterally outwardly and in spaced relation relative to the node;

oxidation barrier blocks of a second material which is different in composition from the first material forming the insulating layer, and which further are positioned laterally outwardly and in spaced relation relative to the node and in covering relation relative to the lateral edges of the electrically conductive reaction barrier layer, and wherein the oxidation barrier blocks have exposed lateral edges and a thickness dimension which is substantially equal to the thickness dimension of the conductive reaction barrier layer;

a lower capacitor plate positioned in covering relation relative to the reaction barrier layer and the oxidation barrier blocks, the lower capacitor plate having lateral edges which are substantially coplanar with the exposed lateral edges of the oxidation barrier blocks, and wherein only the lateral edges of the oxidation barrier blocks are exposed, and wherein no portion of the oxidation barrier block extends laterally outwardly relative to the lateral edges of the lower capacitor plate;

a dielectric layer of Barium Strontium Titanate positioned over the first capacitor plate and the exposed lateral edges of both the oxidation barrier blocks and the first capacitor plate; and an upper capacitor plate positioned over the dielectric layer of Barium Strontium Titanate.

\* \* \* \* \*

UNITED STATES PATENT AND TRADEMARK OFFICE
CERTIFICATE OF CORRECTION

PATENT NO. : 5,808,854
DATED : September 15, 1998
INVENTOR(S) : Thomas A. Figura, Paul J. Schuele It is certified that error appears in the above-identified patent and that said Letters Patent is hereby corrected as shown below:

In column 1, line 19, after the word "invention", please insert the words --relates to--.

Signed and Sealed this

Fifth Day of January, 1999

Attest:

Attesting Officer

*Acting Commissioner of Patents and Trademarks*